US 9,419,582 B2

(12) United States Patent
Kawasaki (10) Patent No.: US 9,419,582 B2
(45) Date of Patent: Aug. 16, 2016

(54) FILTER DEVICE AND DUPLEXER

(71) Applicant: Murata Manufacturing Co., Ltd., Nagaokakyo-shi, Kyoto-fu (JP)

(72) Inventor: Koichiro Kawasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/606,139

(22) Filed: Jan. 27, 2015

(65) Prior Publication Data

US 2015/0130558 A1 May 14, 2015

Related U.S. Application Data

(63) Continuation of application No. PCT/JP2013/065583, filed on Jun. 5, 2013.

(30) Foreign Application Priority Data

Aug. 30, 2012 (JP) ................................. 2012-189542

(51) Int. Cl.
*H03H 7/46* (2006.01)
*H03H 7/01* (2006.01)
*H03H 9/70* (2006.01)

(52) U.S. Cl.
CPC .............. *H03H 7/463* (2013.01); *H03H 7/0115* (2013.01); *H03H 7/0161* (2013.01); *H03H 7/1708* (2013.01); *H03H 9/70* (2013.01); *H03H 2240/00* (2013.01); *H03H 2250/00* (2013.01)

(58) Field of Classification Search
CPC ... H03H 7/0115; H03H 7/0161; H03H 7/463; H03H 9/70; H03H 9/725; H03H 9/706; H03H 7/1708; H03H 2240/00; H03H 2250/00
USPC .......... 333/133, 175, 185, 187, 188, 193–196
See application file for complete search history.

(56) References Cited

U.S. PATENT DOCUMENTS 5,905,418 A     5/1999  Ehara et al.
2007/0024392 A1  2/2007  Inoue et al.
(Continued)

FOREIGN PATENT DOCUMENTS

CN      1905365 A     1/2007
CN      102545829 A   7/2012
(Continued)

OTHER PUBLICATIONS

Official Communication issued in International Patent Application No. PCT/JP2013/065583, mailed on Aug. 13, 2013.
Official Communication issued in corresponding European Patent Application No. 13833128.5, mailed on Mar. 17, 2016.
Joshi, H. et al., "Dual-Band Lumped-Element Bandpass Filter", IEEE Transactions on Microwave Theory and Techniques, vol. 54, No. 12, Dec. 1, 2006, pp. 4169-4177.

*Primary Examiner* — Benny Lee
*Assistant Examiner* — Jorge Salazar, Jr.
(74) *Attorney, Agent, or Firm* — Keating & Bennett, LLP (57) ABSTRACT

A filter device includes a band pass filter connected between a first signal terminal and a second signal terminal and an LC circuit connected in parallel with the band pass filter. The LC circuit has anti-resonant characteristics that make the LC circuit be open at a pass band of the band pass filter, and make attenuation in a specified frequency band outside of the pass band of the band pass filter higher than in a case in which the LC circuit is not connected, as a result of the LC circuit being connected.

22 Claims, 6 Drawing Sheets

(56) References Cited

U.S. PATENT DOCUMENTS

| | | |
|---|---|---|
| 2011/0074527 A1 | 3/2011 | Wakata |
| 2011/0304410 A1 | 12/2011 | Yoshikawa et al. |
| 2012/0119847 A1* | 5/2012 | Iwaki ................... H03H 9/0542 333/133 |

FOREIGN PATENT DOCUMENTS

| | | |
|---|---|---|
| JP | 62-261211 A | 11/1987 |
| JP | 10-256809 A | 9/1998 |
| JP | 2004-248321 A | 9/2004 |
| JP | 2012-109818 A | 6/2012 |

\* cited by examiner

FILTER DEVICE AND DUPLEXER

BACKGROUND OF THE INVENTION

1. Field of the Invention

The present invention relates to band pass filter devices and duplexers including the same.

2. Description of the Related Art

To date, various band pass filters have been used in mobile communication apparatuses such as cellular phones. In cellular phones, for example, frequency bands separating the pass bands of a plurality of channels have become narrower. Hence, it is strongly required that attenuation in the vicinity of the pass bands be increased.

Japanese Unexamined Patent Application Publication No. 62-261211 discloses a filter device in which a delay element is connected in parallel with a main filter. The characteristics of the delay element are set in such a manner that, at a desired frequency within the attenuated region of the main filter, the delay element has nearly the same amplitude characteristics as the main filter and has a phase which is different from that of the main filter by $(2n-1)\pi$ (n is a positive integer). As a result, a direct wave at the desired frequency is cancelled out, and the attenuation at the desired frequency can be increased.

In Japanese Unexamined Patent Application Publication No. 62-261211, the delay element described above is formed of, for example, a transversal SAW filter.

On the other hand, Japanese Unexamined Patent Application Publication No. 10-256809 discloses a filter device in which an auxiliary circuit is connected in parallel with a band pass filter. In the auxiliary circuit, a variable attenuator is connected in series with a variable phase shifter. The phase can be adjusted by the variable phase shifter. In the variable attenuator, the attenuation of a signal propagating through the auxiliary circuit can be adjusted.

As disclosed in Japanese Unexamined Patent Application Publication No. 62-261211, when a signal flowing through a circuit that is connected in parallel with the filter and a signal flowing through the main filter have the same amplitude but opposite phases at a desired frequency, the attenuation can be made high at the desired frequency. Further, when the filter device disclosed in Japanese Unexamined Patent Application Publication No. 10-256809 is used, by adjusting the adjustment amounts of the variable phase shifter and variable attenuation unit and the attenuation in the variable attenuation unit, the above-described condition, i.e., the same amplitude but opposite phases is satisfied.

However, active elements such as an IC and a diode are used in the auxiliary circuit including the variable phase shifter and variable attenuator disclosed in Japanese Unexamined Patent Application Publication No. 10-256809. Hence, a control circuit is required, thereby making reductions in cost and size difficult. In addition, control currents for operating the active elements are needed, leading to the problem of high power consumption.

SUMMARY OF THE INVENTION

Preferred embodiments of the present invention provide a filter device that allows a control circuit to be omitted and realizes a reduction in cost, a reduction in size, and a reduction in power consumption.

A filter device according to a preferred embodiment of the present invention includes first and second signal terminals, a band pass filter connected between the first signal terminal and the second signal terminal, and an LC circuit connected in parallel with the band pass filter. The LC circuit is configured to have anti-resonant characteristics that make the LC circuit be open at a pass band of the band pass filter, and configured to make attenuation in a specified frequency band outside of the pass band of the band pass filter higher than in a case in which the LC circuit is not connected, as a result of the LC circuit being connected.

In a specific aspect of the filter device according to a preferred embodiment of the present invention, in the specified frequency band outside of the pass band of the band pass filter, the amplitude characteristics and phase characteristics of the LC circuit and the amplitude characteristics and phase characteristics of the band pass filter have a relationship indicating the same amplitude but opposite phases. In this case, the attenuation of the filter device is effectively increased in the specified frequency band.

In another specific aspect of the filter device according to a preferred embodiment of the present invention, the amplitude and phase characteristics of the LC circuit and the amplitude and phase characteristics of the band pass filter have a complex conjugate relationship in the specified frequency band. Note that, in this case, the attenuation of the filter device in the specified frequency band is further effectively increased.

In another specific aspect of the filter device according to a preferred embodiment of the present invention, an anti-resonant frequency of the LC circuit is positioned within the pass band of the band pass filter. In this case, a current flowing through the LC circuit becomes very small in the pass band of the band pass filter. Hence, there is almost no influence on the attenuation characteristics of the band pass filter in the pass band. In addition, power consumption is further reduced.

In still another specific aspect of the filter device according to a preferred embodiment of the present invention, the LC circuit is an LC circuit having a resonant frequency and an anti-resonant frequency. In a preferred embodiment of the present invention, the LC circuit may be an LC circuit that does not have a resonant frequency within the pass band of the band pass filter.

A duplexer according to another preferred embodiment of the present invention includes an antenna terminal connected to an antenna. The duplexer includes a first filter device and a second filter device. The first filter device is defined by the filter device according to a preferred embodiment of the present invention, where the first signal terminal is electrically connected to the antenna terminal. The second filter device is connected to the antenna terminal and has a pass band different from the pass band of the first filter device.

In a specific aspect of the duplexer according to a preferred embodiment of the present invention, an anti-resonant frequency of the LC circuit in the first filter device is positioned between the pass band of the first filter device and the pass band of the second filter device. In this case, attenuation in a region between the pass band of the first filter device and the pass band of the second filter device is effectively increased. Hence, the selectivity of the duplexer is increased.

In another specific aspect of the duplexer according to a preferred embodiment of the present invention, the first filter device is a transmission filter and the second filter device is a reception filter. In this case, the attenuation in a region between the transmission band and the reception band is effectively increased.

In the filter device according to a preferred embodiment of the present invention, since the LC circuit connected in parallel with the band pass filter is configured as described above, attenuation in a specified frequency band outside of the transmission band of the band pass filter is increased. Further, since the LC circuit has anti-resonant characteristics that make the LC circuit be open in the pass band of the band pass filter, almost no current flows through the LC circuit in the pass band of the band pass filter. Hence, the attenuation in the specified frequencies outside of the pass band of the band pass filter is increased without influencing attenuation characteristics in the pass band. In addition, no active elements are required for the LC circuit. Accordingly, a control circuit for controlling an active element can be omitted. Hence, reductions in size, cost, and power consumption are realized.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

Figure 1:
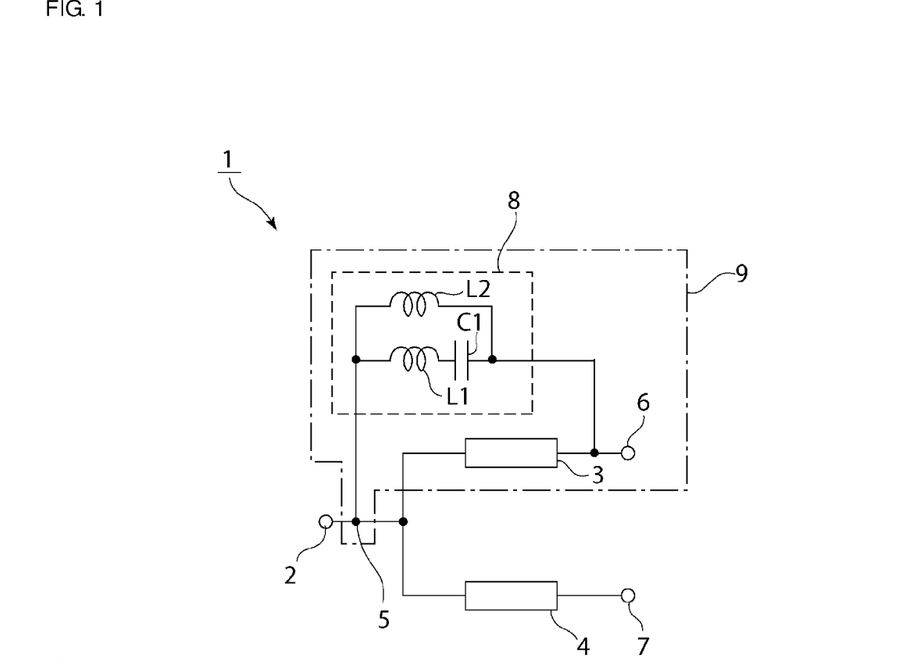
FIG. 1 is a schematic block diagram illustrating a duplexer including a filter device according to a first preferred embodiment of the present invention.

FIG. 1 is a schematic block diagram illustrating a duplexer including a filter device according to a first preferred embodiment of the present invention.

A duplexer 1 is connected to an antenna of a cellular phone. The duplexer 1 includes an antenna terminal 2 to be connected to the antenna. A first band pass filter 3 defining a transmission filter and a second band pass filter 4 defining a reception filter are connected to the antenna terminal 2. The pass band of the first band pass filter 3 is a transmission band. The pass band of the second band pass filter 4 is a reception band and is different from the pass band of the first band pass filter 3.

The first band pass filter 3 described above is connected between a first signal terminal 5 and a second signal terminal 6. The second band pass filter 4 described above is connected between the first signal terminal 5 and a reception terminal 7.

A feature of the present preferred embodiment is that an LC circuit 8 is connected in parallel with the first band pass filter 3 such that a filter device 9 of the present preferred embodiment is provided.

The LC circuit 8 includes an inductor L1 connected between the first signal terminal 5 and the second signal terminal 6. A capacitor C1 is connected in series with the inductor L1. Further, a second inductor L2 is connected in parallel with a circuit element in which the inductor L1 and the capacitor C1 are connected in series. The first inductor L1, the capacitor C1, and the second inductor L2 define the LC circuit 8. The LC circuit 8 is configured to make attenuation in a specified frequency band outside of the pass band of the first band pass filter 3 higher than in the case in which the LC circuit 8 is not connected.

The LC circuit 8 has anti-resonant characteristics that make the LC circuit 8 be open in the pass band of the first band pass filter 3.

Note that the anti-resonant characteristics that make the LC circuit 8 be open in the pass band of the first band pass filter 3 indicate that the pass band is positioned in the vicinity of the anti-resonant frequency. In this case, the anti-resonant frequency may be positioned outside of the pass band. In the vicinity of the anti-resonant frequency, the impedance of the LC circuit 8 is very high. Hence, when the pass band is positioned in the vicinity of the anti-resonant frequency, almost no current flows through the LC circuit 8. In other words, the LC circuit is in a state of being open. Accordingly, an increase in loss in the pass band is avoided since almost no current flows through the LC circuit 8. That is, attenuation in a desired frequency band other than the pass band is increased while maintaining the attenuation in the pass band of the first band pass filter sufficiently low, in accordance with various preferred embodiments of the present invention, as described later.

Compared with the filter characteristics of the first band pass filter 3 alone, the attenuation in a specified frequency band outside of the pass band of the first band pass filter 3 is made high when the LC circuit 8 is connected to the first band pass filter 3. As a result, the attenuation in the specified frequency band outside of the pass band of the first band pass filter 3 is increased. This will be described more specifically with reference to FIG. 2 to FIG. 4.

Figure 2:
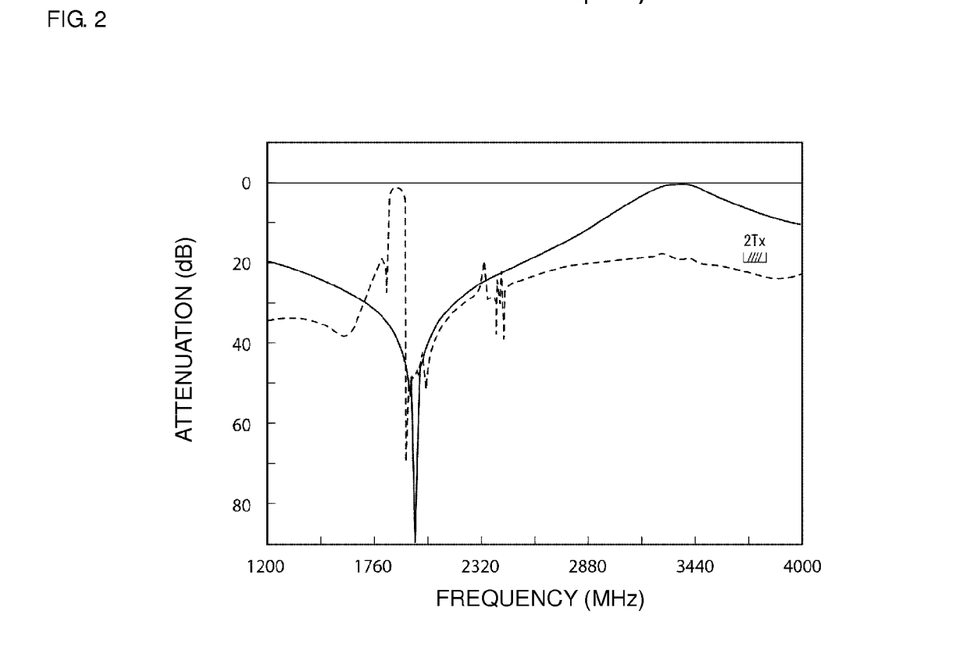
FIG. 2 is a diagram illustrating the attenuation-frequency characteristics of a transmission filter of the duplexer before an LC circuit is connected and the transmission characteristics of the LC circuit, in the first preferred embodiment of the present invention.

The duplexer 1 of the present preferred embodiment is used in UMTS Band 2. In Band 2, the transmission frequency band is in the 1850 MHz to 1910 MHz band, the reception frequency band is the 1930 MHz to 1990 MHz band, and the frequency interval between the two bands is 80 MHz. The broken line in FIG. 2 illustrates the attenuation-frequency characteristics of the case in which the LC circuit 8 is not connected, i.e., the case of the first band pass filter 3 alone. As is clear from FIG. 2, the attenuation is made very low in the 1850 MHz to 1910 MHz transmission frequency band. In the transmission filter of Band 2, high attenuation is required in a band of frequencies twice the transmission frequencies, i.e., 2×(1850-1910)=3700-3820 MHz. The reason for increasing the attenuation is to suppress inter-modulation distortion. With the attenuation-frequency characteristics illustrated by the broken line in FIG. 2, the attenuation in this pass band of frequencies which are twice those of the transmission band is not sufficiently high.

On the other hand, the solid line in FIG. 2 illustrates the transmission characteristics of the LC circuit 8 described above. As is clear from FIG. 2, the LC circuit 8 has a resonant frequency in the vicinity of 3370 MHz and anti-resonant frequency in the vicinity of 2000 MHz.

Hence, the LC circuit 8 has frequency characteristics that make the LC circuit 8 be open in the 1850-1910 MHz band, which is the pass band of the band pass filter 3. Accordingly, almost no current flows through the LC circuit 8 illustrated in FIG. 1 in the pass band of the first band pass filter 3, i.e., the transmission band.

Note that the LC circuit 8 is preferably configured to have resonant characteristics and anti-resonant characteristics illustrated by the broken line in FIG. 2 by adjusting the inductances of the first inductor L1 and the second inductor L2 and the capacitance of the capacitor C1 in accordance with the known specifications. A feature of the present preferred embodiment is that the LC circuit 8 having such resonant and anti-resonant characteristics is connected in parallel with the first band pass filter 3.

Figure 3:
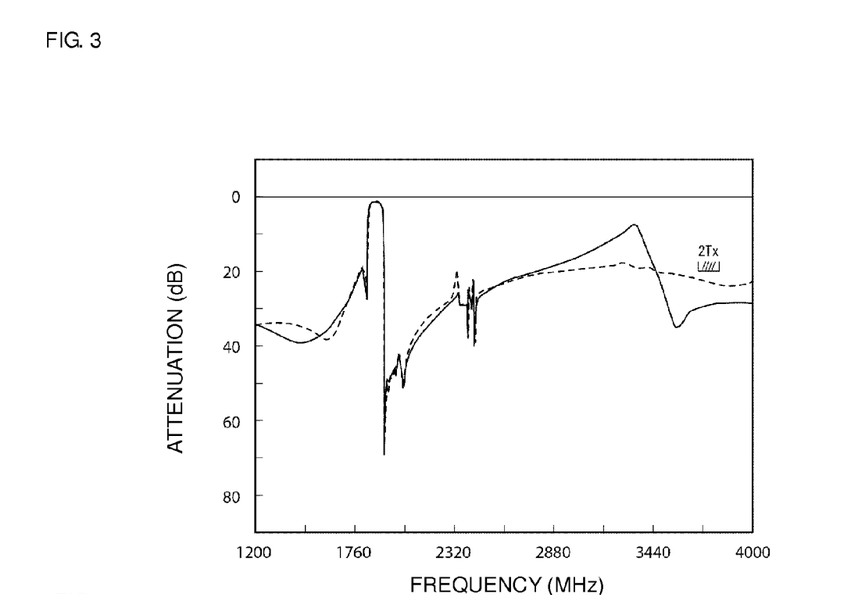
FIG. 3 is a diagram illustrating the attenuation-frequency characteristics of a filter device of the first preferred embodiment of the present invention, and the attenuation-frequency characteristics of the transmission filter of the duplexer to which the LC circuit is not connected.
Figure 4:
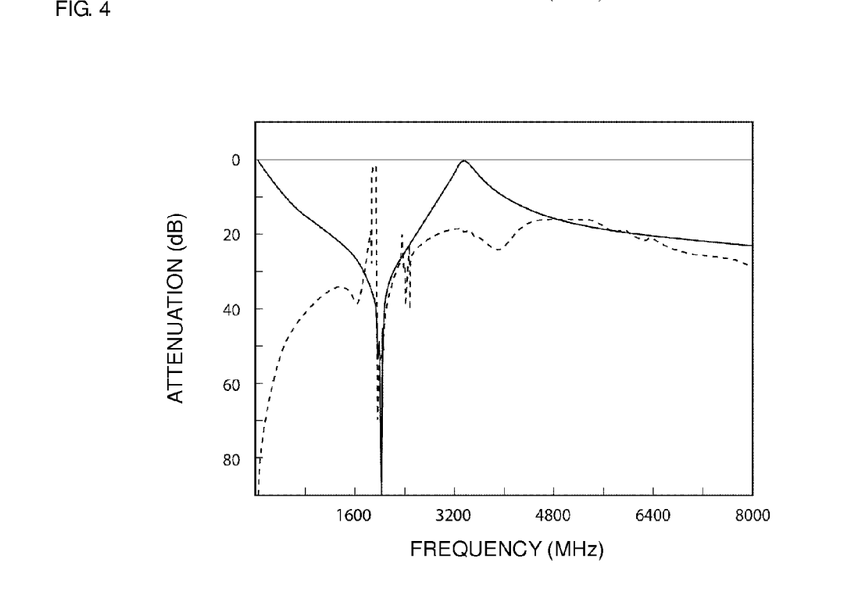
FIG. 4 is a diagram illustrating the attenuation-frequency characteristics of the transmission filter of the duplexer before the LC circuit is connected and the transmission characteristics of the LC circuit, in the case where the measurement frequency band illustrated in FIG. 2 has been widened, in the first preferred embodiment of the present invention.

The solid line in FIG. 3 illustrates the attenuation-frequency characteristics of the filter device 9 described above, and the broken line illustrates the attenuation-frequency characteristics of the first band pass filter 3 alone, similarly to FIG. 2. FIG. 4 is a diagram illustrating the frequency characteristics of the attenuation in the transmission filter of the duplexer before connection of the LC circuit thereto and the transmission characteristics of the LC circuit, in the case where the measurement frequency band illustrated in FIG. 2 has been widened. In other words, FIG. 4 is a diagram illustrating the attenuation-frequency characteristics of the filter device 9, using a dashed line, which shows the frequency characteristics of the attenuation of the transmission filter of the duplexer, together with the transmission characteristics of the LC circuit 8 in an overlapping manner.

A band denoted by 2Tx in FIG. 3 is a frequency band having frequencies twice the frequencies of the transmission frequency band. As is clear from the comparison of the solid line and the broken line in FIG. 3, in the filter device 9 of the present preferred embodiment, the attenuation in the band 2Tx is increased from about 23 dB to about 30 dB, for example. Hence, according to the filter device 9 of the present preferred embodiment, since the LC circuit 8 described above is configured to be able to increase attenuation in a specified frequency band outside of the pass band of the first band pass filter 3, i.e., in the band 2Tx, the attenuation of the filter device 9 in the band 2Tx is increased.

In the band 2Tx described above, it is preferable that the amplitude and phase characteristics of the LC circuit 8 and the amplitude and phase characteristics of the band pass filter 3 have a relationship indicating the same amplitude but opposite phases. In other words, in the band 2Tx, it is preferable that the amplitude and phase characteristics of the LC circuit 8 and the amplitude and phase characteristics of the band pass filter have a complex conjugate relationship. In this case, as disclosed in Japanese Unexamined Patent Application Publication No. 62-261211, the attenuation in a frequency band with the same amplitude with an opposite phase is effectively increased.

Note that it is assumed that the term "the same amplitude" used above refers not only to the case in which the amplitudes of the two signals are exactly the same but also to the case in which the amplitude of one signal is within about −3 dB to about 2 dB, for example, of the amplitude of the other signal when compared on the basis of a log ratio. In other words, the two signals need not necessarily be exactly the same.

Further, it is assumed that the term "opposite phases" refers not only to the case in which the phases of two signals are exactly opposite but also to the case in which the phases are different from each other within the range of about ±20 degrees. Even when the phases are different from each other within such a range, sufficiently high attenuation is obtained at a desired frequency.

In the present preferred embodiment, as described above, attenuation in the band 2Tx is increased using the LC circuit 8. The LC circuit 8 does not need an active element. Hence, a control circuit for driving an active element can be omitted. Accordingly, reductions in size, cost, and power consumption is realized while increasing attenuation outside of a band.

Figure 5:
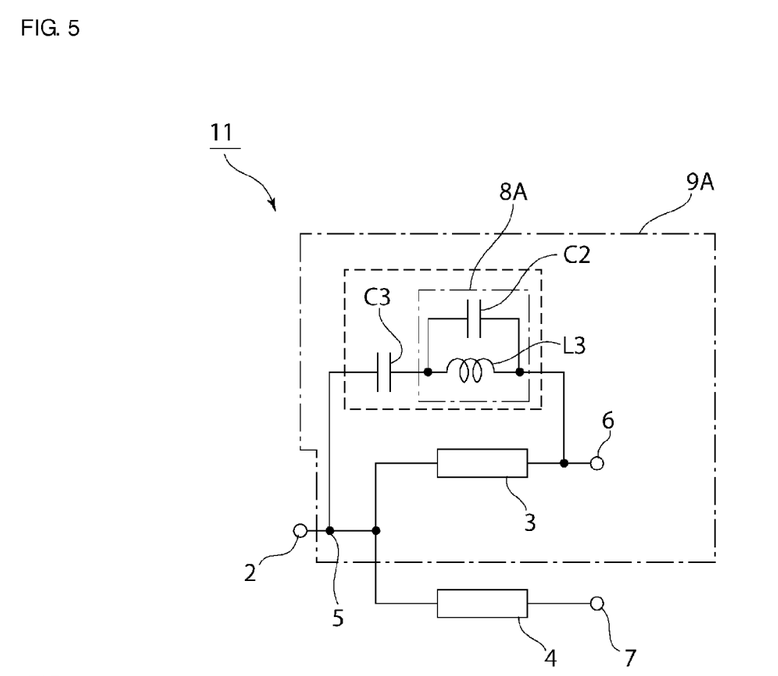
FIG. 5 is a schematic block diagram illustrating a duplexer including a filter device according to a second preferred embodiment of the present invention.

FIG. 5 is a schematic block diagram illustrating a duplexer including a filter device according to a second preferred embodiment of the present invention. A duplexer 11 of the second preferred embodiment performs transmission and reception of signals in UMTS Band 2, similarly to the duplexer 1 of the first preferred embodiment. Similarly to the duplexer 1, the duplexer 11 includes the first signal terminal 5 connected to the antenna terminal 2. The first band pass filter 3 is connected between the first signal terminal 5 and the second signal terminal 6 as a transmission terminal. The second band pass filter 4 as a reception filter is connected between the first signal terminal 5 and the reception terminal 7. These configurations are the same as those of first preferred embodiment. Unlike the first preferred embodiment, an LC circuit 8A is used instead of the LC circuit 8 in the second preferred embodiment. In other words, the LC circuit 8A is connected in parallel with the first band pass filter 3 such that a filter device 9A of the second preferred embodiment is provided.

The LC circuit 8A is connected in parallel with the first band pass filter 3 to increase attenuation in the vicinity of 1500 MHz, which is a pass band for a GPS signal. More specifically, the LC circuit 8A includes an inductor L3, a first capacitor C2, and a second capacitor C3. The self-resonant frequency of the inductor L3 is positioned in the vicinity of the pass band of the first band pass filter 3. The first capacitor C2 is connected in parallel with the inductor L3. As a result, an LC parallel resonant circuit is provided. Further, the second capacitor C3 is connected in series with the inductor L3.

Figure 6:
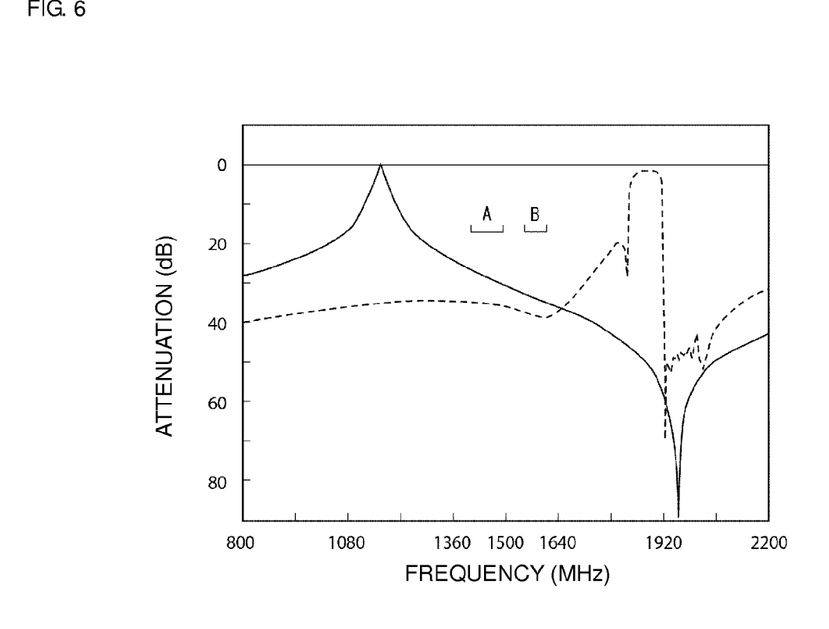
FIG. 6 is a diagram illustrating the attenuation-frequency characteristics of a transmission filter of the duplexer used in the second preferred embodiment of the present invention and the transmission characteristics of an LC circuit.

The solid line in FIG. 6 illustrates the transmission characteristics of the LC circuit 8A and the broken line illustrates the attenuation-frequency characteristics of the first band pass filter 3. In other words, the broken line illustrates the attenuation-frequency characteristics of the first band pass filter 3 alone without connection of the LC circuit 8A. As is clear from the broken line in FIG. 6, the first band pass filter 3 has very low attenuation in the transmission band of Band 2 also in the present preferred embodiment.

On the other hand, in the transmission characteristics of the LC circuit 8A, an anti-resonant frequency is positioned in the vicinity of the pass band of the first band pass filter 3, i.e., 1960 MHz. The resonant frequency is positioned near the vicinity of 1160 MHz. The frequency bands A and B in FIG. 6 illustrate frequency bands in which the attenuation of the filter device 9A is to be increased in the present preferred embodiment. Specifically, the frequency band A is the Band 11 transmission band and the frequency band B is the GPS transmission band. In a module device supporting a plurality of frequency bands, for example, in a module device that includes a GPS device and a filter supporting Band 11, noise needs to be suppressed in the GPS frequency band and the Band 11 frequency band. Hence, it is required that attenuation is increased in a plurality of frequency bands.

In the present preferred embodiment, in 1500 MHz, the inductance of the inductor L3 and the capacitances of the capacitors C2 and C3 are set such that a signal of the LC circuit 8A and a signal of the first band pass filter 3 have the same amplitude but opposite phases.

Figure 7:
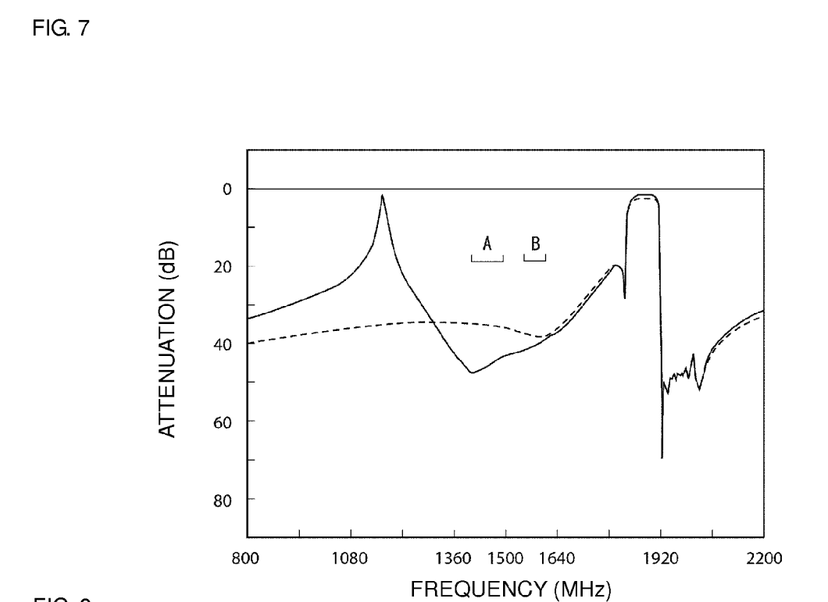
FIG. 7 is a diagram illustrating the attenuation-frequency characteristics of the transmission filter in the second preferred embodiment of the present invention and the attenuation-frequency characteristics of the transmission filter before the LC circuit is connected.

The broken line in FIG. 7 illustrates the attenuation-frequency characteristics of the above-described first band pass filter 3 alone and the solid line illustrates the attenuation-frequency characteristics of the filter device 9A. As is clear from FIG. 7, in a frequency band A, the attenuation according to the present preferred embodiment is increased to about 42-43 dB, while the attenuation is about 35 dB in the filter characteristics illustrated by the broken line corresponding to the case in which the LC circuit 8A is not connected, for example.

In other words, also in the present preferred embodiment, as a result of the LC circuit 8A having an anti-resonant frequency at a frequency outside of the pass band of the first band pass filter 3 and being connected to the first band pass filter 3, attenuation at specified frequencies outside of the pass band of the first band pass filter 3 is increased.

Also in the present preferred embodiment, the LC circuit 8A required to increase attenuation in the above described frequency band A and frequency band B includes the inductor L3 and the capacitors C2 and C3. Hence, no active elements are required. Accordingly, reductions in size, cost, and power consumption are realized, similarly to the first preferred embodiment.

Figure 8:
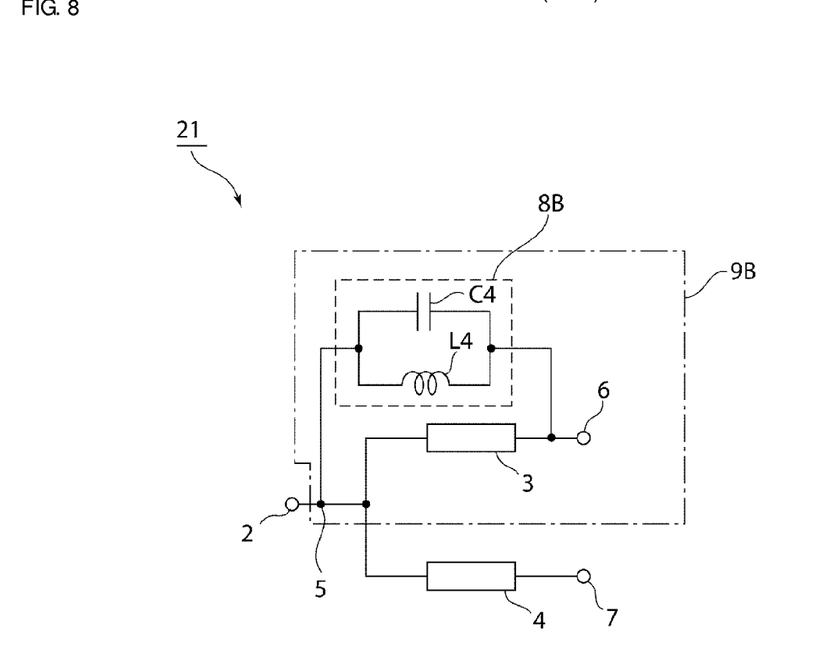
FIG. 8 is a schematic block diagram illustrating a filter device according to a third preferred embodiment of the present invention.

FIG. 8 is a schematic block diagram illustrating a duplexer according to a third preferred embodiment of the present invention. Also in the present preferred embodiment, similarly to the first preferred embodiment, the first band pass filter 3 and the second band pass filter 4 are connected to the first signal terminal 5 which is connected to the antenna terminal 2. A duplexer 21 is also a duplexer that performs transmission and reception of UMTS Band 2.

Unlike the first preferred embodiment, in the present preferred embodiment, an LC circuit 8B is connected in parallel with the first band pass filter 3 such that a filter 9B is provided.

The LC circuit 8B includes an inductor L4 and a capacitor C4 connected in parallel with the inductor L4. Hence, the LC circuit 8B is defined by a combination of two passive elements. Accordingly, reductions in size, cost, and power consumption compared with a phase and attenuation adjusting circuit using active elements such as a diode and an IC are realized.

Also in the present preferred embodiment, attenuation at 1500 MHz, which is a specified frequency outside of the pass band of the first band pass filter 3 is increased by connection of the LC circuit 8B. This will be described with reference to FIG. 9 and FIG. 10.

Figure 9:
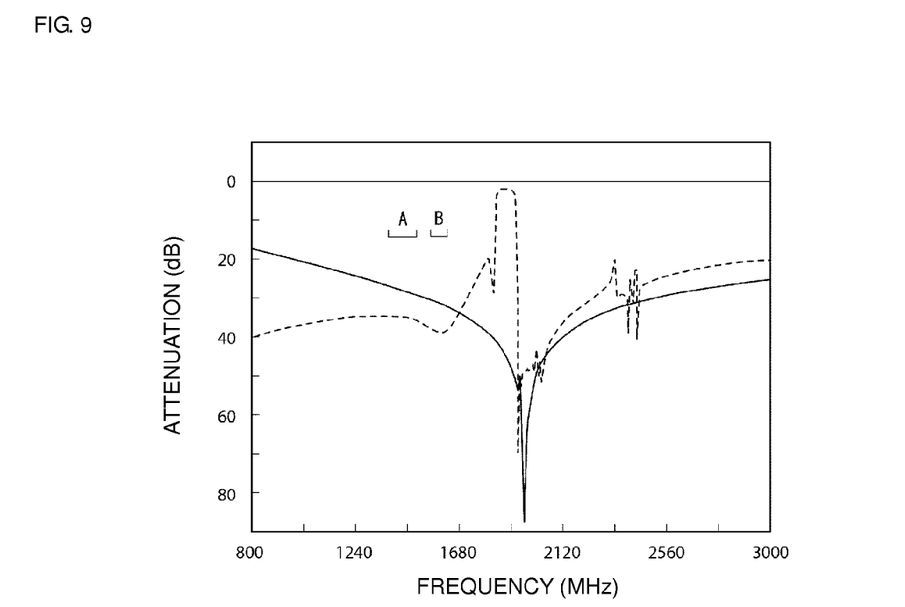
FIG. 9 is a diagram illustrating the attenuation-frequency characteristics of a transmission filter of the duplexer used in the third preferred embodiment of the present invention and the transmission characteristics of an LC circuit.

The broken line in FIG. 9 illustrates the attenuation-frequency characteristics of the first band pass filter 3 alone. The solid line illustrates the transmission characteristics of the LC circuit 8B. The LC circuit 8B, which includes the inductor L4 and the capacitor C4 connected in parallel with each other, does not have resonant characteristics and has only anti-resonant characteristics.

As is clear from FIG. 9, the anti-resonant frequency of the LC circuit 8B is positioned in the vicinity of 1840 MHz, i.e., positioned in the vicinity of and outside of the pass band of the first band pass filter 3. Hence, the LC circuit 8B is in an open state in the pass band of the first band pass filter 3. Accordingly, almost no current flows through the LC circuit 8B in the pass band of the first band pass filter 3. Hence, an increase in power consumption is avoided.

Figure 10:
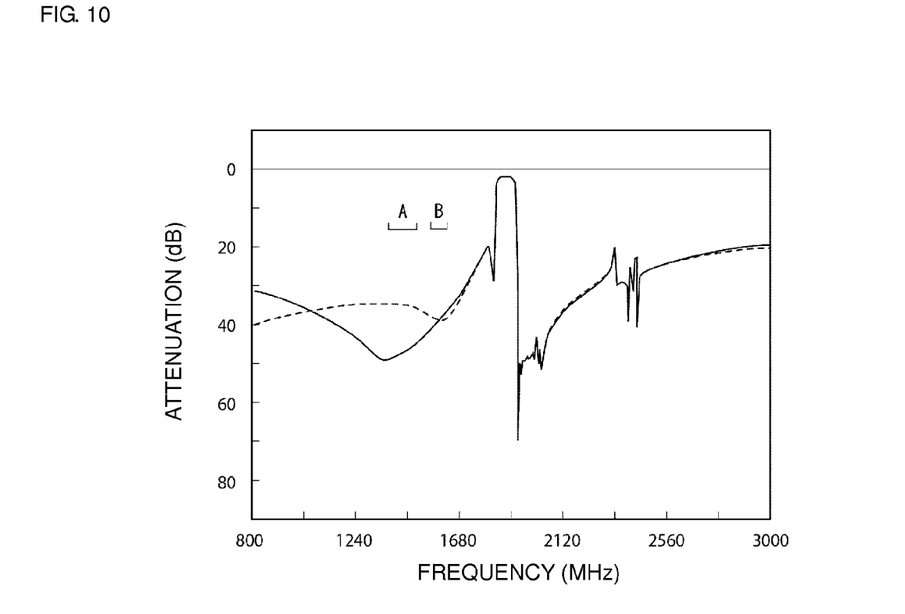
FIG. 10 is a diagram illustrating the frequency characteristics of a transmission filter of the third preferred embodiment of the present invention and the attenuation-frequency characteristics of a transmission filter of the duplexer to which the LC circuit is not connected.

The solid line in FIG. 10 illustrates the attenuation-frequency characteristics of the filter device 9B of the present preferred embodiment, and the broken line illustrates the attenuation-frequency characteristics of the first band pass filter 3 alone. As is clear from FIG. 10, in the pass band for Band 11 and in a frequency band in the vicinity of the GPS frequency band, attenuation is significantly improved in accordance with the present preferred embodiment. In other words, it can be seen that although the attenuation is about 35 dB with the first band pass filter 3 alone, the attenuation is increased to about 42-44 dB in accordance with the present preferred embodiment.

Also in the present preferred embodiment, since the LC circuit 8B does not need an active element, reductions in cost, size, and power consumption are realized.

Figure 11A:
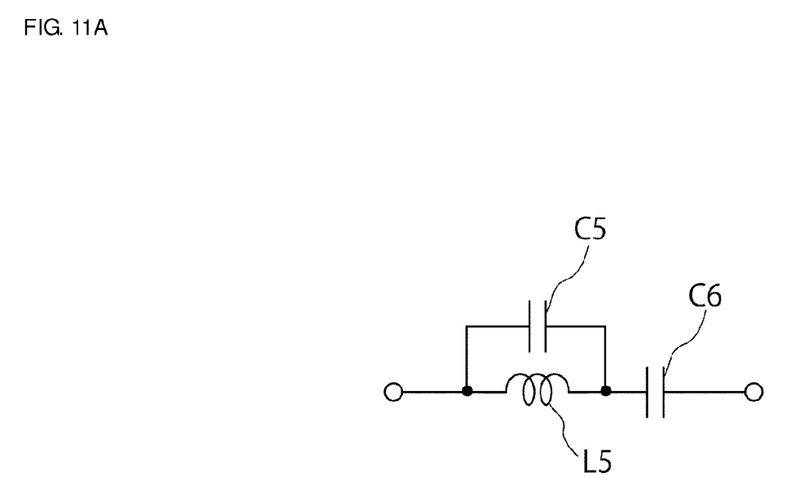
FIG. 11A to FIG. 11C are circuit diagrams illustrating modifications of an LC circuit.

Note that the circuit configuration of the LC circuit in various preferred embodiments of the present invention is not limited to the LC circuits 8, 8A, and 8B used in the first to third preferred embodiments. Referring to FIG. 11A, a configuration may be used in which a capacitor C5 is connected in parallel with an inductor L5 and a capacitor C6 is connected in series with the inductor L5.

Figure 11B:
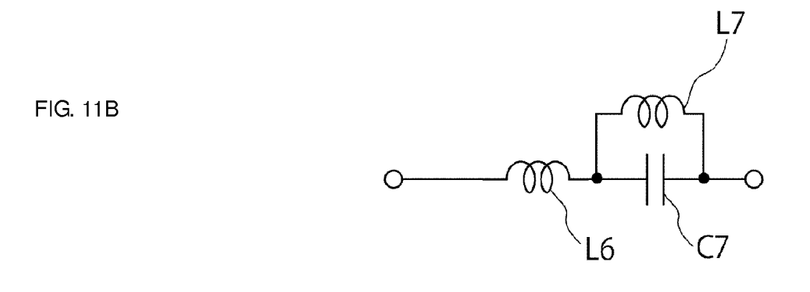

Referring to FIG. 11B, a configuration may be used in which a capacitor C7 is connected in series with an inductor L6 and an inductor L7 is connected in parallel with the capacitor C7.

Figure 11C:
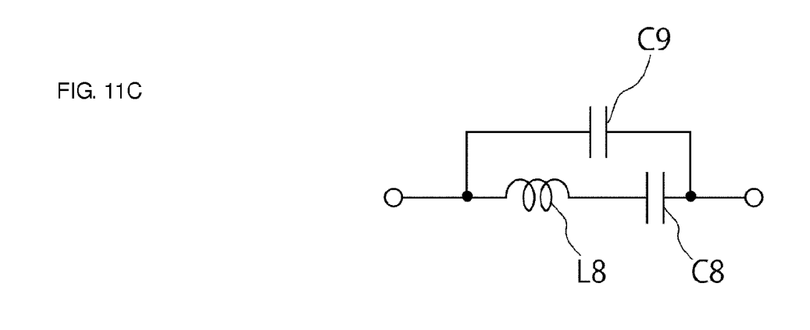

Further, referring to FIG. 11C, a configuration may be used in which an inductor L8 and a capacitor C8 are connected in series and a capacitor C9 is connected in parallel with this circuit element in which the inductor L8 and the capacitor C8 are connected in series.

As is seen from the modifications of the LC circuit illustrated in FIGS. 11A-11C, the LC circuit in the present invention is not specifically limited as long as the LC circuit is configured to have an anti-resonant frequency that makes the LC circuit be open in the pass band of a band pass filter and configured to be able to increase attenuation in a specified frequency band outside of the pass band.

Further, although examples adapted to a transmission filter in UMTS Band 2 have been shown in the first to third preferred embodiments described above, the present invention is not limited to these. For example, by connecting an LC circuit in parallel with the second band pass filter 4, which is a reception filter, attenuation outside of the pass band of the reception filter is increased.

Further, preferred embodiments of the present invention preferably are used to increase attenuation outside of pass bands in various bands other than Band 2 or in other communication systems.

According to various preferred embodiments of the present invention, attenuation in a desired frequency band outside of the pass band of a band pass filter is increased by connecting an LC circuit in parallel with the band pass filter as described above. Hence, attenuation outside of a band using an LC circuit is increased regardless of a frequency region, for example, in a cellular phone in which the duplexer 1 and WRAN functionality are provided, when attenuation outside of the band of the duplexer 1 is to be increased in the WRAN pass band, the circuit constants of the LC circuit 8 are adjusted so as to be able to increase the attenuation in the WRAN band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   first and second signal terminals;
   a band pass filter connected between the first signal terminal and the second signal terminal; and
   an LC circuit having an anti-resonant frequency and being connected in parallel with the band pass filter; wherein
   the LC circuit is configured such that the anti-resonant frequency has characteristics that make the LC circuit be open at a pass band of the band pass filter, and so as to make attenuation in a specified frequency band outside of the pass band of the band pass filter higher than in a case in which the LC circuit is not connected.

2. The filter device according to claim 1, wherein in the specified frequency band outside of the pass band of the band pass filter, respective amplitude characteristics and phase characteristics of the LC circuit and respective amplitude characteristics and phase characteristics of the band pass filter have a same respective amplitude but opposite phases.

3. The filter device according to claim 2, wherein respective amplitude and phase characteristics of the LC circuit and respective amplitude and phase characteristics of the band pass filter have a complex conjugate relationship in the specified frequency band.

4. The filter device according to claim 3, wherein the LC circuit has a resonant frequency.

5. The filter device according to claim 3, wherein the LC circuit does not have a resonant frequency within the pass band of the band pass filter.

6. The filter device according to claim 2, wherein the LC circuit does not have a resonant frequency within the pass band of the band pass filter.

7. The filter device according to claim 2, wherein the anti-resonant frequency of the LC circuit is in a vicinity of the pass band of the band pass filter.

8. The filter device according to claim 2, wherein the LC circuit has a resonant frequency.

9. The filter device according to claim 1, wherein the LC circuit has a resonant frequency.

10. The filter device according to claim 1, wherein respective amplitude and phase characteristics of the LC circuit and respective amplitude and phase characteristics of the band pass filter have a complex conjugate relationship in the specified frequency band.

11. A duplexer including an antenna terminal connected to an antenna, the duplexer comprising:
    filter device defined by the filter device according to claim 10, with the first signal terminal being electrically connected to the antenna terminal;
    a second filter device that is connected to the antenna terminal and that has a pass band different from the pass band of the first filter device; wherein
    the anti-resonant frequency of the LC circuit in the first filter device is positioned between a pass band of the first filter device and a pass band of the second filter device.

12. The duplexer according to claim 11, wherein the first filter device is a transmission filter and the second filter device is a reception filter.

13. The filter device according to claim 10, wherein the anti-resonant frequency of the LC circuit is in a vicinity of the pass band of the band pass filter.

14. The filter device according to claim 10, wherein the LC circuit has a resonant frequency.

15. The filter device according to claim 10, wherein the LC circuit does not have a resonant frequency within the pass band of the band pass filter.

16. The filter device according to claim 1, wherein the anti-resonant frequency of the LC circuit is in a vicinity of the pass band of the band pass filter.

17. The filter device according to claim 16, wherein the LC circuit has a resonant frequency.

18. The filter device according to claim 16, wherein the LC circuit does not have a resonant frequency within the pass band of the band pass filter.

19. A duplexer including an antenna terminal connected to an antenna, the duplexer comprising:
    filter device defined by the filter device according to claim 1, with the first signal terminal being electrically connected to the antenna terminal;
    a second filter device that is connected to the antenna terminal and that has a pass band different from the pass band of the first filter device.

20. A duplexer including an antenna terminal connected to an antenna, the duplexer comprising:
    filter device defined by the filter device according to claim 1, with the first signal terminal being electrically connected to the antenna terminal;
    a second filter device that is connected to the antenna terminal and that has a pass band different from the pass band of the first filter device; wherein
    the anti-resonant frequency of the LC circuit in the first filter device is positioned between a pass band of the first filter device and a pass band of the second filter device.

21. The duplexer according to claim 20, wherein the first filter device is a transmission filter and the second filter device is a reception filter.

22. The filter device according to claim 1, wherein the LC circuit does not have a resonant frequency within the pass band of the band pass filter.

* * * * *